US006440834B2

(12) United States Patent
Daubenspeck et al.

(10) Patent No.: US 6,440,834 B2
(45) Date of Patent: Aug. 27, 2002

(54) METHOD AND STRUCTURE FOR A SEMICONDUCTOR FUSE

(75) Inventors: Timothy Harrison Daubenspeck, Colchester; William Thomas Motsiff, Essex Junction; Jed Hickory Rankin, Burlington, all of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/827,871

(22) Filed: Apr. 6, 2001

Related U.S. Application Data

(62) Division of application No. 09/326,437, filed on Jun. 4, 1999, now Pat. No. 6,249,038.

(51) Int. Cl.[7] .......................... H01L 21/44; H01L 29/00
(52) U.S. Cl. ...................... 438/601; 438/132; 438/600; 257/529
(58) Field of Search ................................ 438/132, 600, 438/601; 257/529, 209; 365/200; 327/525

(56) References Cited

U.S. PATENT DOCUMENTS

| 5,645,746 A | 7/1997 | Walsh |
|---|---|---|
| 5,663,702 A | 9/1997 | Shaw, Jr. et al. |
| 5,777,540 A | 7/1998 | Dedert et al. |
| 5,834,824 A | 11/1998 | Shepherd et al. |
| 6,078,091 A | 6/2000 | MacPherson et al. |
| 6,096,566 A | 8/2000 | MacPherson et al. |
| 6,162,686 A * | 12/2000 | Huang et al. ................ 438/281 |
| 6,288,436 B1 * | 9/2001 | Narayan et al. ............ 257/529 |
| 6,300,233 B1 * | 10/2001 | Lee et al. .................... 438/601 |
| 6,375,159 B2 * | 4/2002 | Daubenspeck et al. ...... 257/529 |

FOREIGN PATENT DOCUMENTS

| EP | 0 115 191 A | 8/1984 |
|---|---|---|

* cited by examiner

*Primary Examiner*—Carl Whitehead, Jr.
*Assistant Examiner*—Maria Guerrero
(74) *Attorney, Agent, or Firm*—Scully, Scott, Murphy & Presser; Howard J. Walter

(57) ABSTRACT

A semiconductor fuse structure having a conductive fuse material abutting a first and second conductive line is provided. The fuse of the present invention does not substantially damage the surrounding semiconductor material therefore it can be used with a wide variety of materials including porous, mechanically fragile, low dielectric constant materials and high conductive metals like Cu. Methods of fabricating such a semiconductor fuse structure are also provided herein.

29 Claims, 5 Drawing Sheets

METHOD AND STRUCTURE FOR A SEMICONDUCTOR FUSE

RELATED APPLICATIONS

This application is a divisional of U.S. application Ser. No. 09/326,437, filed Jun. 4, 1999 now U.S. Pat. No. 6,249,038.

FIELD OF THE INVENTION

The present invention relates to a fuse for use in a semiconductor structure, and more particular to a novel semiconductor fuse which can be employed with low dielectric constant materials as well as copper wiring. The novel fuses of the present invention do not substantially damage the surrounding semiconductor structure when the fuse is deleted. Moreover, the novel fuse of the present invention affords a greater opportunity for providing semiconductor structures having denser fuse layouts as well as a higher number of fuses thereon. The present invention also provides methods of forming the novel semiconductor fuses of the present invention.

BACKGROUND OF THE INVENTION

In today's generation of semiconductor chips, there are up to 5000 fuses per chip with as many as 1000–4000 deletes per second required to make laser blow technology economically feasible. In future chips, the number of fuses per chip may grow even higher, e.g. 50,000 or more.

In conventional fusing, either laser delete of the metal conductors or electrically blowing the polysilicon fuse links is employed. Both of these existing technologies involve relatively large amounts of energy to superheat and delete the fuse. Such prior art methods are detrimental to the integrity of low dielectric constant materials, particularly foam type materials, thus limiting their use as interlayer dielectric films.

Because of line to line coupling which slows signal propagation, there is a trend for the interlevel dielectric to be composed of a low dielectric constant material such as a polyimide nanofoam or a porous glass such as zero gel. The low dielectric constant materials are not solids and thus they will collapse when their thermal budget or glass transition temperature, Tg, (about 300° C.) or mechanical strength is exceeded. Moreover, to improve signal propagation in semiconductor chips, high conductance materials such as copper are now being used as the conductive material.

There are two problems associated with using the above materials. First, conventional laser blowing (or even electric blowing) will damage the low dielectric constant material causing it to collapse, changing its dielectric constant and integrity. When copper or another suitable high conductance material is used, particles of the high conductance material may be released into the pores of the low dielectric constant material. This release may cause a potential reliability problem which could compromise the performance of the basic local structure of the semiconductor chip.

In view of the drawbacks with prior art blowing methods, there is a need for developing a new and improved semiconductor fuse structure which contains a fuse that causes little or no damage to the surrounding structure when the fuse is deleted. The fuse must also offer the opportunity for denser fuse layouts and the capability of providing a higher number of fuses in the semiconductor structure. Any new fuse structure must be able to use low dielectric constant materials as well as high conductance materials, e.g. Cu.

SUMMARY OF THE INVENTION

One object of the present invention is to provide a method of fabricating a semiconductor structure having a fuse which is compatible with a wide variety of materials, including low dielectric constant materials and high conductance materials.

A further object of the present invention is to provide a method of manufacturing a fuse for a semiconductor structure which when blown does little or no damage to the surrounding structure.

A still further object of the present invention is to provide a method of fabricating a semiconductor structure having a denser fuse layout as well as a higher number of fuses than conventional semiconductor fuse structures.

These and other objects and advantages can be obtained using one of the methods of the present invention. The first method of the present invention for forming a semiconducting fuse comprises the steps of:

(a) providing a semiconductor structure, said structure comprising a least one wiring level formed on a semiconductor substrate;

(b) forming a first dielectric layer on a surface of said semiconductor structure;

(c) forming a first and second conductive line in said first dielectric layer, each conductive line having an end, said ends being in proximity to each other;

(d) forming a second dielectric layer on said first dielectric layer covering said first and second conductive lines;

(e) forming a hole in said second dielectric layer, said hole at least exposing a portion of said first and second conductive line; and (f) filling said hole with a conductive fuse material so as to provide an electrical connection between the first and second conductive lines.

It is noted that the hole provided in step (e) is at least to the upper surface of the first and second conductive lines. In one embodiment of the present invention, the hole extends between the ends of the first and second conductive lines. In this embodiment, the fuse material forms an electrical contact at the ends of the conductive lines. In another embodiment of the first method of the present invention, a passivating layer or a polish stop layer is positioned between said first and second dielectric layers.

The second method of the present invention comprises the steps of:

(a) providing a semiconductor structure, said structure comprising at least one wiring level formed on a semiconductor substrate;

(b) forming a first dielectric layer on a surface of said semiconductor structure;

(c) forming at least one electrically connected conductive line in said first dielectric layer;

(d) forming a second dielectric layer on said first dielectric layer covering said at least one electrically connected conductive line;

(e) forming a hole in said second dielectric layer, said hole bisecting said at least one electrically connected conductive line into a first non-electrically connected conductive line and a second non-electrically connected conductive line, each line having an end, wherein said ends are in proximity to each other; and (f) filling said hole with a conductive fuse material so as to provide an electrical connection between the first and second conductive lines.

Another aspect of the present invention relates to a semiconductor fuse structure. Specifically, the fuse structure of the present invention comprises:

a semiconductor structure having at least one wiring level formed on a semiconductor substrate;

a first dielectric layer formed on a surface of said semiconductor structure;

a first and second conductive line formed in said first dielectric layer, each conductive line having an end, wherein said ends are in proximity to each other;

a second dielectric layer formed on said first dielectric layer covering said first and second conductive lines, said second dielectric layer having a contact hole therein exposing said first and second conductive lines; and a conductive fuse material formed in said contact hole so as to provide an electrical connection between said first and second conductive lines.

DETAILED DESCRIPTION OF THE INVENTION

Figure 1A:
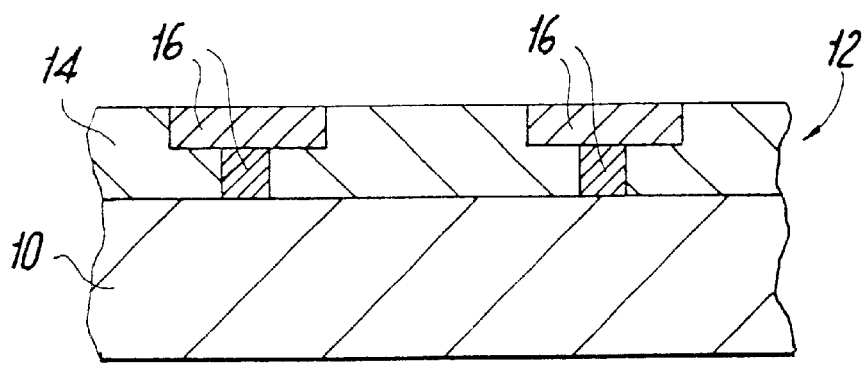
FIGS. 1(a)–(f) show one possible method that can be employed in fabricating the semiconductor fuse structure of the present invention.

The present invention, which provides a novel semiconductor fuse structure and methods to form the same, will now be described in greater detail by referring to the drawings that accompany the present application. It is noted that in the accompanying drawings like and/or corresponding elements are referred to by like reference numerals.

Reference is first made to FIGS. 1(a)–(f) which show one method that can be used in fabricating the inventive semiconductor fuse structure. Specifically, FIG. 1(a) illustrates the initial semiconductor structure that can be employed in the present invention in fabricating the inventive semiconductor fuse structure. The initial semiconductor structure shown in FIGS. 1(a) (and 2(a)) comprises a semiconductor substrate 10 having at least one wiring level 12 formed thereon. Wiring level 12 comprises a conductive region 16 made of lines and vias as well as an interlevel dielectric layer 14. Although only one wiring level is shown, the present invention contemplates more than one wiring level in the initial structure.

It is noted that the drawings show only the areas wherein the fuse is to be formed. The pad region and associated wiring which is used in connecting the semiconductor fuse structure of the present invention to an external structure such as a circuit board, card or like structure is not shown. Those skilled in the art would know what the pad region of the present invention looks like. Conventional soldering, e.g. control collapse chip connection (C4), and wire bonding may be employed in connecting the pad region to an external structure.

The initial semiconductor structure shown in FIG. 1(a) is composed of conventional materials that are well known in the art and it is fabricated using techniques that are also well known in the art. For example, semiconductor substrate 10 is composed of any semiconducting material including, but not limited to: Si, Ge, SiGe, GaAs, InAs, InP, all other III/V compounds and organic semiconductors. Semiconductor substrate 10 may be doped or undoped and it may contain active device regions therein. For simplicity, the drawings of the present invention do not show the active device regions, nevertheless the same may be present in the semiconductor substrate.

Conductive region 16 comprises conventional conductive materials including, but not limited to: noble metals, noble metal oxides, conductive oxides and mixtures and multilayers thereof. Exemplary conductive materials include: Cu, Al, Pt, Ti, W, Ta, TiN, TaN, polysilicon, and $WSi_2$. The conductive regions of the wiring level and any subsequent wiring level may comprise the same or different conductive materials.

Interlevel dielectric layer 14 is composed of any inorganic or organic dielectric material known in the art including, but not limited to: $SiO_2$, $Si_3N_4$SiCOH, diamond, diamond-like carbon, paralyene polymers, polyimides, silicon-containing polymers, porous glass and other suitable dielectric materials. Interlevel dielectric layer 14 may include a barrier layer 34 on the surface thereof, See FIG. 3. Suitable barrier layers include: conventional passivation materials and/or polish stop layers. Exemplary barrier layers that may optionally be employed in the present invention include: $SiO_2$, $Al_2O_3$, $Si_3N_4$, TaN, polyimides and other like materials that are capable of serving as a passivating and/or polish stop layer. A barrier layer under the fuse area is highly preferred in the present invention since it limits the depth of the fuse.

As stated above, the initial structure shown in FIG. 1(a) is fabricated using conventional processing steps that are well known to those skilled in the art including: semiconductor device fabrication and back end of the line processing. Since such techniques are well known in the art, a detailed description of the same is not needed herein. It is noted that the structure shown in FIG. 1(a) may be planarized using conventional planarization techniques such as chemical-mechanical polishing (CMP) or grinding prior to forming the fuse region therein.

Any exposed surface of the conductive region of the initial semiconductor structure may be subjected to an appropriate surface treatment step prior to forming the fuse region therein. Suitable surface treatment steps include: oxidation by plasma ashing, thermal oxidation, surface chemical treatments and application of a thin metal oxide layer by chemical solution dissolution (CSD), chemical vapor deposition (CVD) or physical vapor deposition (PVD).

A fuse region is then formed over, and in electrical contact with at least two conductive regions of the initial semiconductor structure shown in. FIG. 1(a). Specifically, the fuse region is formed by forming a first dielectric layer 18 over the initial semiconductor structure, i.e. on top of either interlevel dielectric layer 14 or optional barrier layer 34. First dielectric layer 18 is formed using conventional deposition processes that are well known in the art including: CVD, plasma-assisted chemical vapor deposition, sputtering, spin-on coating and other like deposition processes.

Figure 3:
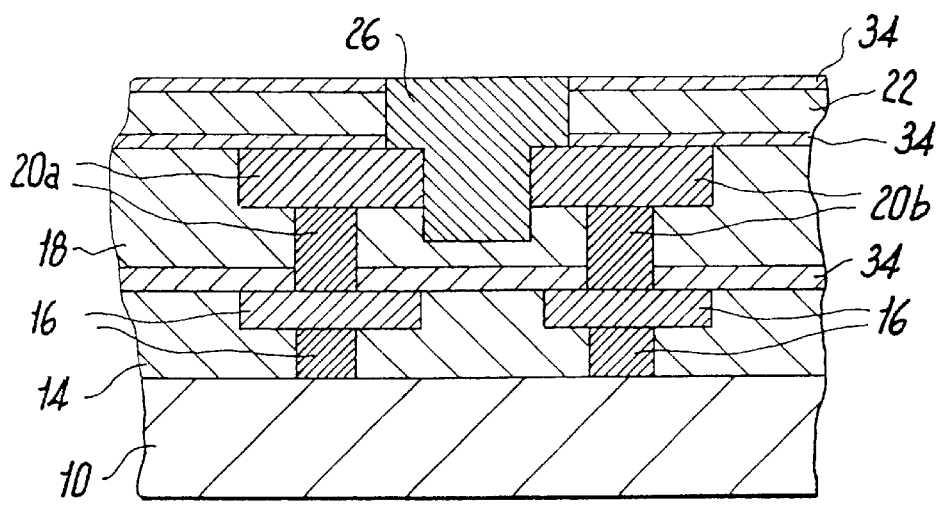
FIG. 3 shows an alternative semiconductor fuse structure of the present invention wherein a passivation or polish layer is formed between successive interlevel dielectrics.

First dielectric layer 18 may be composed of the same or different dielectric material as the interlevel dielectric layer of wiring level 12. When different dielectric materials are employed, an optional barrier layer 34, as shown in FIG. 3, may be used to isolate the different dielectric layers.

A first and second conductive line portion, 20a and 20b, is then formed in first dielectric layer 18 using the same back end of the line processes as used in forming the conductive regions of the wiring level.

Specifically, first and second conductive portions 20a and 20b are formed so that the same are in electrical contact with the underlying conductive regions of wiring level 12. More specifically, the first and second conductive portions are formed by opening vias in the first dielectric layer so as to expose the underlying conductive region, filling the vias with a conductive material, planarizing that structure, opening at least one trench over said conductive filled via, filling said trenches with a conductive material and thereafter planarizing the filled trench structure. Alternatively, the vias and trenches can be both opened and the combined structure filled with a conductive material and thereafter planarized. The structure that is obtained after forming the first dielectric layer and the first and second conductive portions is shown in FIG. 1(b).

Figure 1B:
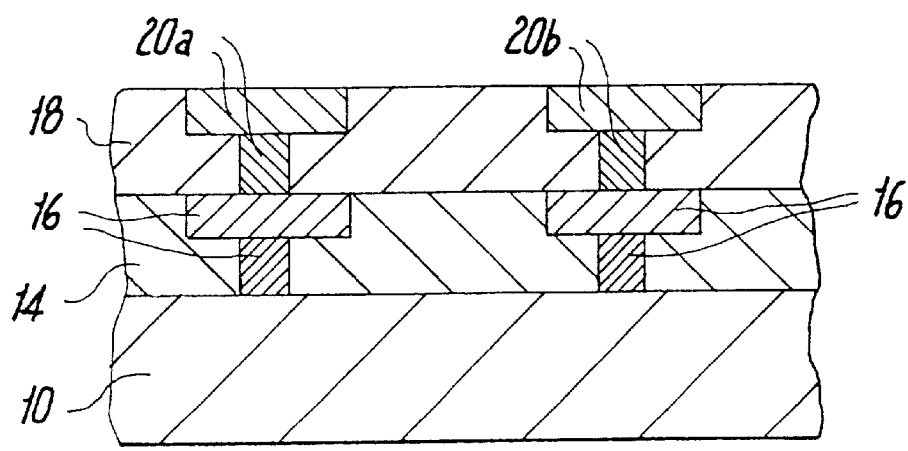
Figure 2A:
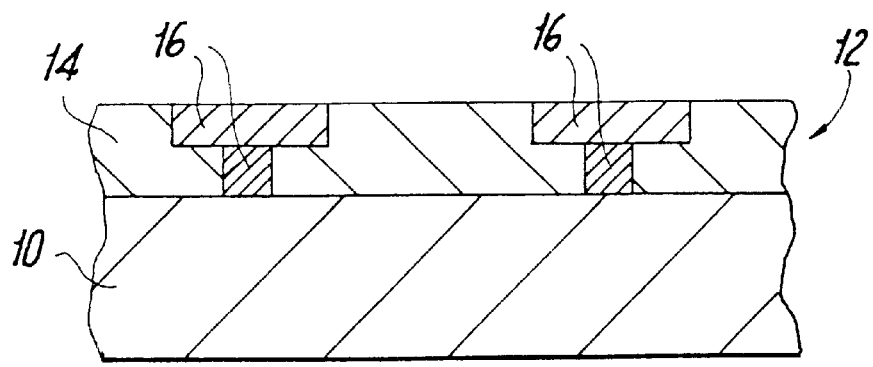
FIGS. 2(a)–(f) show another possible method that can be employed in fabricating the semiconductor fuse structure of the present invention.
Figure 2B:
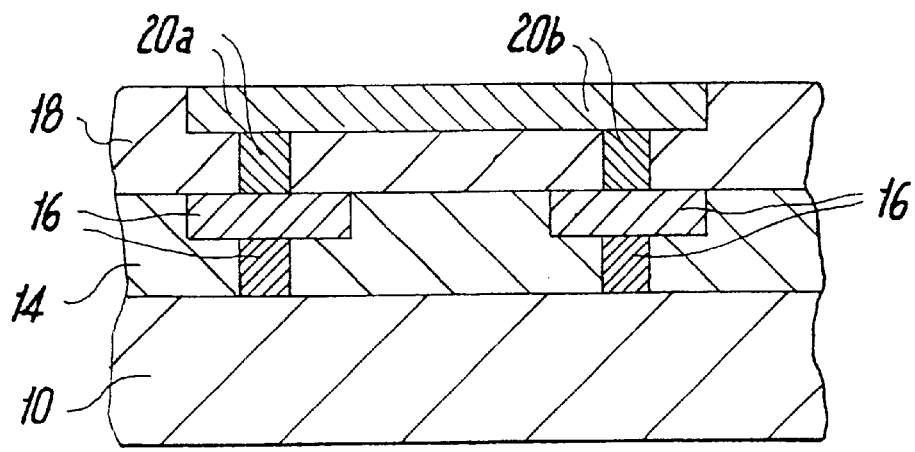
Figure 2C:
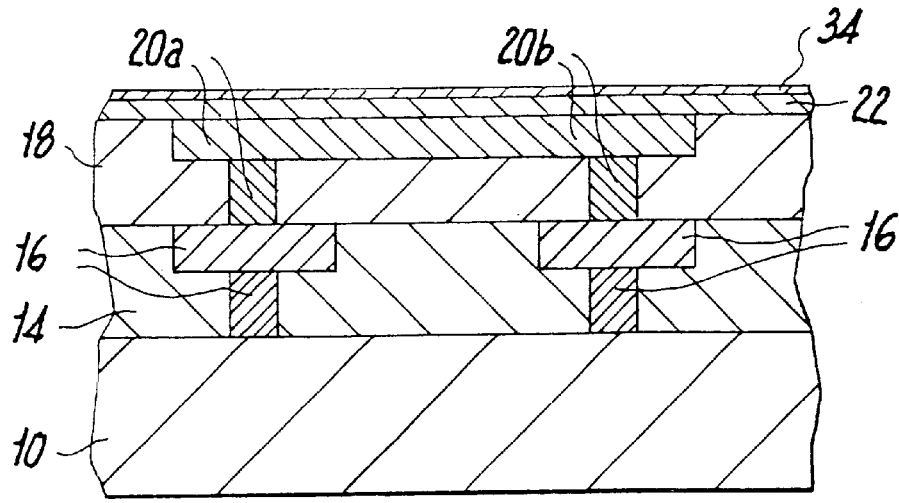

It is noted that the present invention contemplates forming first and second conductive portions as shown in FIG. 1(b) wherein each conductive line has an end, said ends being in proximity to each other. In addition to the embodiment shown in FIG. 1(b), the present invention also contemplates the embodiment shown in FIG. 2(b) wherein an electrical connected conductive line 20 is formed in first dielectric layer 18. As shown therein, the electrically conductive line does not contain any gaps in the conductive line as is the case in FIG. 1(b).

Figure 1C:
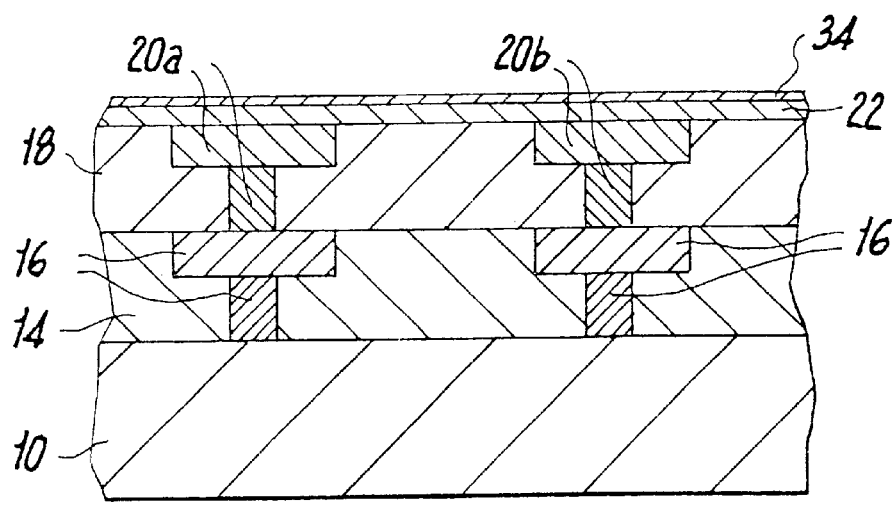

Returning back to the embodiment shown in FIG. 1(b), a second dielectric layer 22 is then formed on top of first dielectric layer 18 using the same deposition techniques as mentioned hereinabove (See FIG. 1(c)). The second dielectric layer may be composed of the same or different dielectric material as interlevel dielectric layer 14 or first dielectric layer 18. When different dielectric materials are employed, barrier layer 34, such as shown in FIG. 3, may be employed. An optional barrier layer 34 may also be formed on top of second dielectric layer 22. This optional embodiment of the present invention is depicted in FIG. 1(c).

Figure 1D:
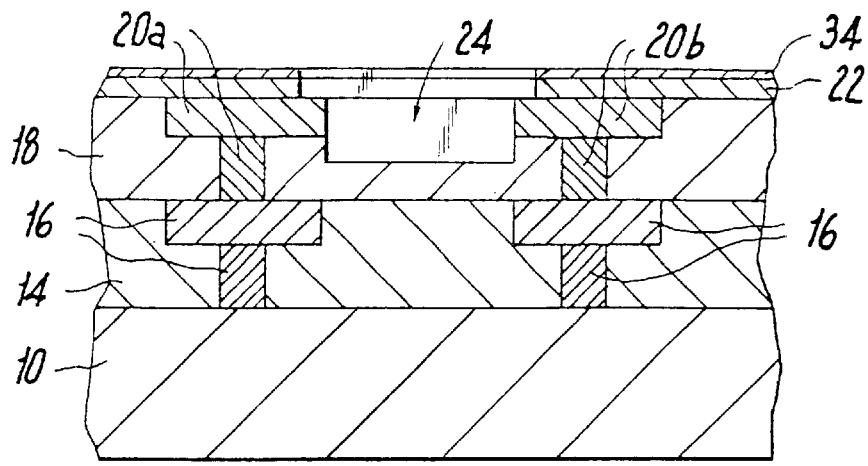
Figure 4:
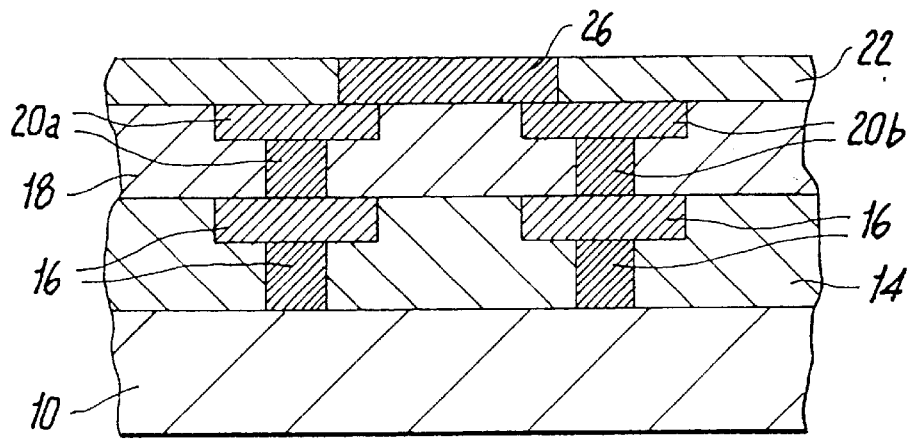
FIG. 4 shows another possible alternative semiconductor fuse structure of the present invention wherein a conductive fuse material is formed only on top of the first and second conductive portions.

Next, as shown in FIG. 1(d), hole 24 is formed in optional barrier layer 34 and/or second dielectric layer 22 using conventional techniques well known in the art such as lithography and RIE or direct laser ablation. The hole may be provided in one step or multiple steps may be used to first remove the optional barrier layer and thereafter second dielectric layer 22. With direct laser ablation, a laser that is capable of providing a pulse or multiple pulse beams of wavelength that is absorbed by the optional barrier layer and/or dielectric, but that does not melt the conductive lines of the structure, is employed. Typically, laser ablation is carried out using a laser having a wavelength in the mid to deep UV region (150–400 nm). Spot size and energy are set by the design and material requirements. Spot size typically is 0.5–4 $\mu$m and the energy typically is between 0.1–10 $\mu$j. It is noted that direct laser ablation is generally, but not always, employed when a low dielectric constant material such as a polyimide foam is employed as the dielectric material. Hole 24 is formed between the first and second conductive line portions, as shown in FIG. 1(d), through the electrically conductive line portion such as shown in FIG. 2(d), or to the top of first and second conductive line portions as shown in FIG. 4.

Figure 2D:
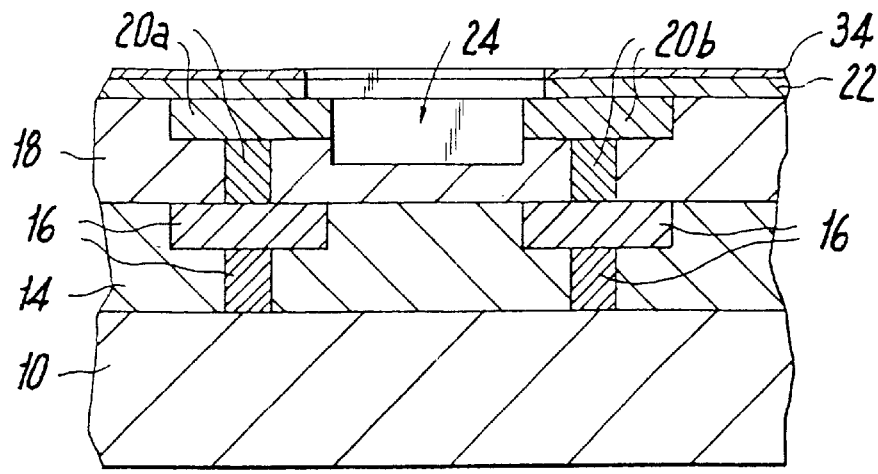

When a hole is formed through the electrically connected conductive line portion having no gaps such as shown in FIG. 2(d), the hole bisects the conductive line into a first and second conductive line portion having ends that are not in contact with each other. The ends are however in proximity to each other so as to permit formation of a fuse therebetween.

If needed, the exposed conductive lines can be treated using one of the above mentioned surface treatment techniques.

Figure 1E:
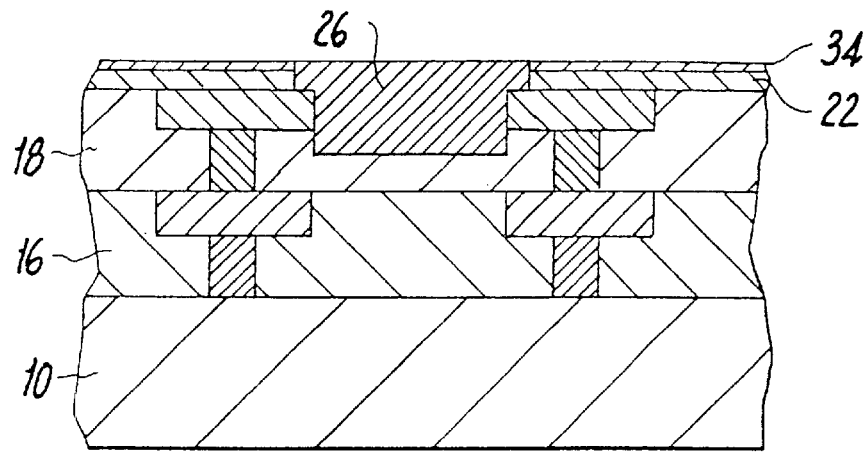
Figure 2E:
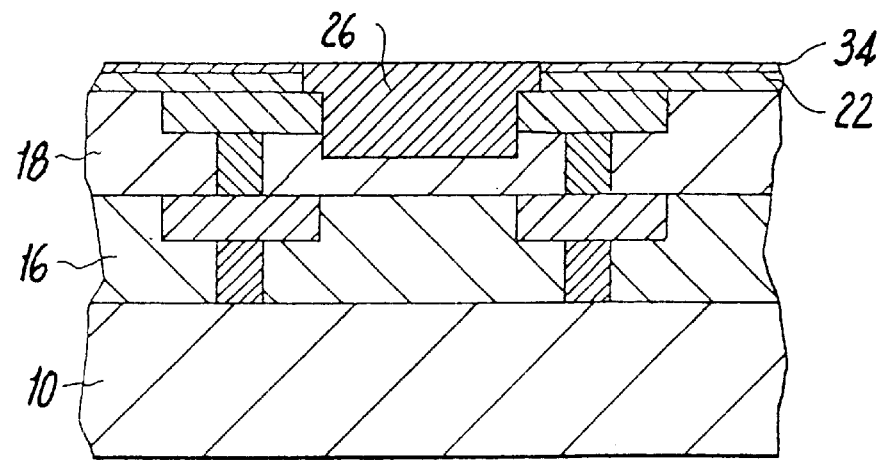

After forming hole 24 in the structure, a conductive fuse material 26 is then deposited on the structure filling hole 24. This is illustrated in FIGS. 1(e) and 2(e). Suitable conductive fuse materials that may be employed in the present invention include conductive polymers, examples of which include, but are not limited to: polyanilines, polypyrroles and polyalkylthiophenes. If desired, conductivity of these polymers can be enhanced with the addition of an organometallic or other dopant.

The conductive fuse material 26 forms an electrical connection, i.e. fuse, between the first and second conductive line portions in the fuse area of the structure, See FIGS. 1(e), 2(e) and 4. The conductive material, i.e. fuse, is formed using conventional deposition processes including evaporation, screening, spin-on coating, and other like deposition processes. After depositing the conductive fuse material, a conventional planarization process and/or a surface treatment process may be employed.

The pad region, not shown, may be opened using laser ablation or lithography and RIE and it may then be connected to an external structure using solder ball technology or wire bonding.

Figure 1F:
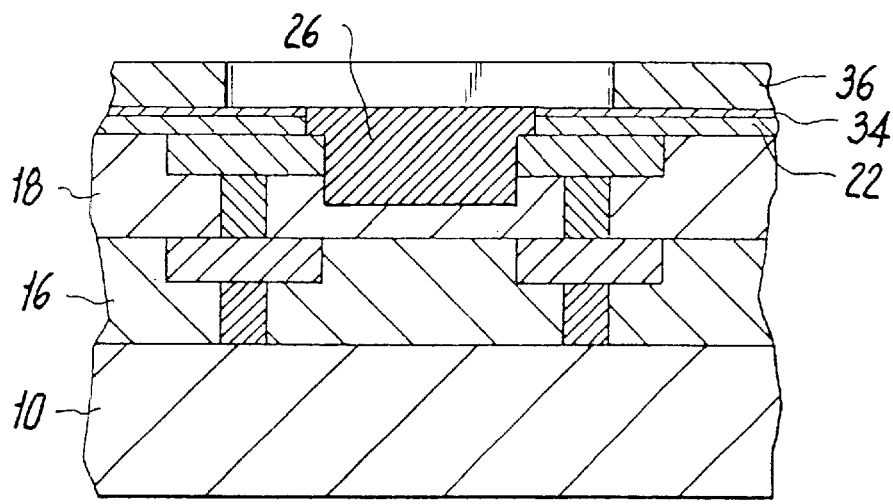
Figure 2F:
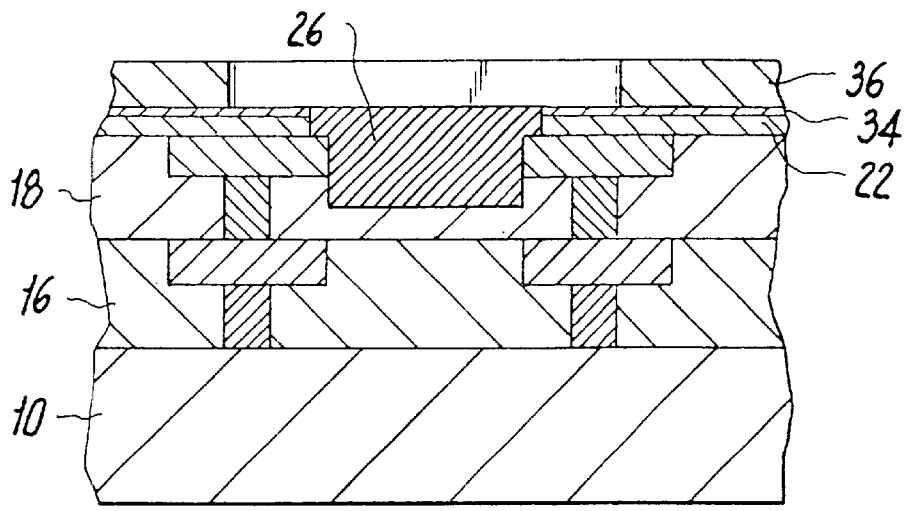

FIGS. 1(f) and 2(f) show a passivated fuse structure that can be obtained in the present invention. Specifically, the structures shown in FIGS. 1(f) and 2(f) are formed by forming passivating layer 36 on top of either second dielectric layer 22 or optional barrier layer 34 using conventional deposition techniques well known in the art. Any conventional passivating material, e.g. polyimides, can be employed in the present invention. Lithography and RIE or laser ablation can be used to provide windows over the fuse area as well as the pad region.

Figure 5A:
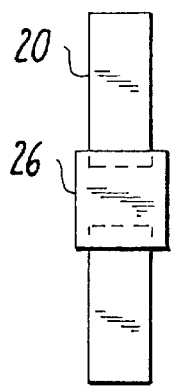
FIGS. 5(a)–(c) show some variations of a top view of the inventive fuse.
Figure 5B:
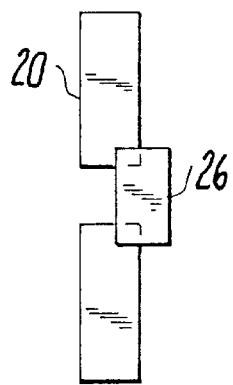
Figure 5C:
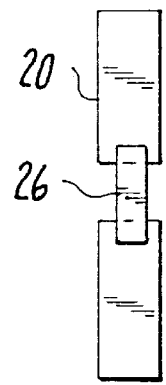

FIGS. 5(a)–(c) show top views of the fuse region of the present invention. In these figures, reference numeral 20 represents the conductors whereas reference numeral 26 represents the fuse. In FIG. 5(a), the fuse is depicted as being larger than the conductors. In FIGS. 5(b)–(c), the fuses are depicted as being smaller than the conductors. In FIG. 5(b), the fuse is show as not being perfectly aligned with the conductors, whereas in FIG. 5(c), the fuse is in substantial alignment with the conductors. The fuse of the present invention works well in both cases.

While the present invention has been particularly shown and described with respect to the preferred embodiments thereof, it will be understood by those skilled in the art that the foregoing and other changes in form and details may be made therein without departing from the spirit and scope of the present invention. It is therefore intended that the present invention not be limited to the exact forms described and illustrated, but fall within the scope of the appended claims.

Having thus described our invention in detail, what we claim as new and desire to secure by the Letters Patent is:

1. A method of forming a semiconductor fuse structure comprising the steps of:

(a) providing a semiconductor structure, said structure comprising at least one wiring level formed on a semiconductor substrate;

(b) forming a first dielectric layer having an upper surface on a surface of said semiconductor structure;

(c) forming first and second conductive lines in said first dielectric layer, each conductive line having an end and a top surface that is coplanar with said upper surface of said first dielectric layer, said ends being in proximity to each other, (d) forming a second dielectric layer on said first dielectric layer covering said first and second conductive lines;

(e) forming a hole in said second dielectric layer, said hole at least exposing a portion of said first and second conductive lines; and (f) filling said hole with a conductive fuse material to provide an electrical connection between said first and second conductive lines.

2. The method of claim 1 wherein said semiconductor substrate is a semiconducting material selected from the group consisting of Si, Ge, SiGe, GaAs, InAs, InP, other III/V compounds and organic semiconductors.

3. The method of claim 1 wherein said first and second dielectric layers are composed of the same or different dielectric material selected from the group consisting of $SiO_2$, $Si_3N_4$, SiCOH, diamond, diamond-like carbon, paralyene polymers, polyimides, silicon-containing polymers and porous glass.

4. The method of claim 1 wherein a barrier layer is formed between the first and second dielectric layers.

5. The method of claim 1 wherein said first and second conductive lines are composed of a noble metal, noble metal oxide, conductive oxide or mixtures and multilayers thereof.

6. The method of claim 1 wherein said hole is formed by lithography and reactive ion etching or laser ablation.

7. The method of claim 1 wherein said hole extends to the top surface of said first and second conductive lines or extends between said ends of said first and second conductive lines.

8. The method of claim 1 further comprising forming a passivating layer after step (f) and thereafter patterning said passivating layer by lithography and RIE or laser ablation to provide a window above said conductive fuse material.

9. The method of claim 1 wherein said wiring level comprises an interlevel dielectric layer having conductive regions formed therein.

10. The method of claim 1 wherein said conductive fuse material comprises a conductive polymer.

11. The method of claim 1 further comprising forming an optional barrier layer on said second dielectric layer prior to opening said hole.

12. The method of claim 9 wherein said conductive region comprises a noble metal, noble metal oxide, conductive oxide or mixtures and multilayers thereof.

13. The method of claim 10 wherein said conductive polymer comprises a polyaniline, a polypyrrole or a polyalkylthiophene.

14. The method of claim 13 wherein said conductive polymer is doped.

15. The method of claim 11, wherein said hole is provided in one step or multiple steps wherein a portion of said optional barrier layer is first removed by lithography and RIE or laser ablation and thereafter a portion of said second dielectric layer is removed by lithography and RIE or laser ablation.

16. A method of forming a semiconductor fuse structure comprising the steps of:

(a) providing a semiconductor structure, said structure comprising at least one wiring level formed on a semiconductor substrate;

(b) forming a first dielectric layer having an upper surface on a surface of said semiconductor substrate;

(c) forming at least one electrically connected conductive line having a top surface that is coplanar with said upper surface of said first dielectric layer in said first dielectric layer, said at least one electrically connected conductive line having no gaps;

(d) forming a second dielectric layer on said first dielectric layer covering said at least one electrically connected conductive line;

(f) forming a hole in said second dielectric layer, said hole bisecting said at least one electrically conned conductive line into a first non-electrically connected conductive line and a second non-electrically connected conductive line, each line having an end, wherein said ends are in proximity to each other; and (g) filling said hole with a conductive fuse material to provide an electrical connection between the first and second conductive lines.

17. The method of claim 16 wherein said semiconductor substrate is a semiconducting material selected from the group consisting of Si, Ge, SiGe, GaAs, InAs, InP, other III/V compounds and organic semiconductors.

18. The method of claim 16 wherein said first and second dielectric layers are composed of the same or different dielectric material selected from the group consisting of $SiO_2$, $Si_3N_4$, SiCOH, diamond, diamond-like carbon, paralyene polymers, polyimides, silicon-containing polymers and porous glass.

19. The method of claim 16 wherein a barrier layer is formed between the first and second dielectric layers.

20. The method of claim 16 wherein said electrically conductive line having no gaps is composed of a noble metal, noble metal oxide, conductive oxide or mixtures and multilayers thereof.

21. The method of claim 16 wherein said hole is formed by lithography and reactive ion etching or laser ablation.

22. The method of claim 16 further comprising forming a passivating layer after step (f) and thereafter patterning said passivating layer by lithography and RIE or laser ablation to provide a window above said conductive fuse material.

23. The method of claim 16 wherein said wiring level comprises an interlevel dielectric layer having conductive regions formed therein.

24. The method of claim 16 wherein said conductive fuse material comprises a conductive polymer.

25. The method of claim 16 further comprising forming an optional barrier layer on said second dielectric layer prior to opening said hole.

26. The method of claim 23 wherein said conductive region comprises a noble metal, noble metal oxide, conductive oxide or mixtures and multilayers thereof.

27. The method of claim 24 wherein said conductive polymer comprises a polyaniline, a polypyrrole or a polyalkylthiophene.

28. The method of claim 25 wherein said hole is provided in one step or multiple steps wherein a portion of said optional barrier layer is first removed by lithography and RIE or laser ablation and thereafter a portion of said second dielectric layer is removed by lithography and RIE or laser ablation.

29. The method of claim 27 wherein said conductive polymer is doped.

* * * * *